United States Patent
Tsai et al.

(10) Patent No.: US 10,867,909 B1
(45) Date of Patent: Dec. 15, 2020

(54) SEMICONDUCTOR STRUCTURE AND METHOD OF FABRICATING WIRING STRUCTURE

(71) Applicant: MACRONIX INTERNATIONAL CO., LTD., Hsinchu (TW)

(72) Inventors: Meng-Han Tsai, Yunlin County (TW); Yi-Chen Wang, Taichung (TW); Kuan-Chih Chen, New Taipei (TW); Kuang-Wen Liu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/446,724

(22) Filed: Jun. 20, 2019

(30) Foreign Application Priority Data

May 30, 2019 (TW) .............................. 108118802 A

(51) Int. Cl.
*H01L 23/522* (2006.01)
*H01L 23/532* (2006.01)
*H01L 21/3213* (2006.01)
*H01L 21/768* (2006.01)

(52) U.S. Cl.
CPC .... *H01L 23/5226* (2013.01); *H01L 21/32136* (2013.01); *H01L 21/76802* (2013.01); *H01L 21/76877* (2013.01); *H01L 23/53228* (2013.01)

(58) Field of Classification Search
CPC ........... H01L 23/5226; H01L 23/53228; H01L 21/76877; H01L 21/76802; H01L 21/32136
USPC ....... 257/758, 737, 751, 768, 774, 306, 324, 257/E21.018, E21.019, E21.165, E21.507, 257/E21.648, E21.657, E23.021, E23.075, 257/E23.145, E27.088, E27.089, E27.097; 438/104, 157, 253, 381, 382, 622
See application file for complete search history.

(56) References Cited

U.S. PATENT DOCUMENTS

| | | | |
|---|---|---|---|
| 2008/0042273 A1* | 2/2008 | Lin | H01L 28/10 257/737 |
| 2008/0052904 A1 | 3/2008 | Schneider et al. | |
| 2010/0127233 A1 | 5/2010 | Goux et al. | |
| 2011/0156026 A1* | 6/2011 | Yamazaki | H01L 21/02422 257/43 |
| 2014/0210087 A1* | 7/2014 | Kang | H01L 23/528 257/751 |
| 2016/0218070 A1* | 7/2016 | Zhang | H01L 22/12 |
| 2017/0373192 A1* | 12/2017 | Yamazaki | H01L 29/78648 |

(Continued)

FOREIGN PATENT DOCUMENTS

TW      I579849 B     4/2017

*Primary Examiner* — Dao H Nguyen
(74) *Attorney, Agent, or Firm* — McClure, Qualey & Rodack, LLP

(57) ABSTRACT

The semiconductor structure includes a semiconductor device, a first metallization layer on the semiconductor device, a second metallization layer on the first metallization layer, and a third dielectric layer between the first metallization layer and the second metallization layer. The first metallization layer includes a first dielectric layer and a first metal layer disposed in the first dielectric layer, wherein the first metal layer has a first thickness, and the first metal layer comprises copper. The third dielectric layer has a second thickness, and a ratio of the second thickness of the third dielectric layer to the first thickness of the first metal layer is ranged from about 3 to about 20.

20 Claims, 11 Drawing Sheets

(56) References Cited

U.S. PATENT DOCUMENTS

2019/0245543 A1\* 8/2019 Lee .................... H03K 19/1776
2020/0006131 A1\* 1/2020 Shimabukuro ... H01L 23/53266

\* cited by examiner

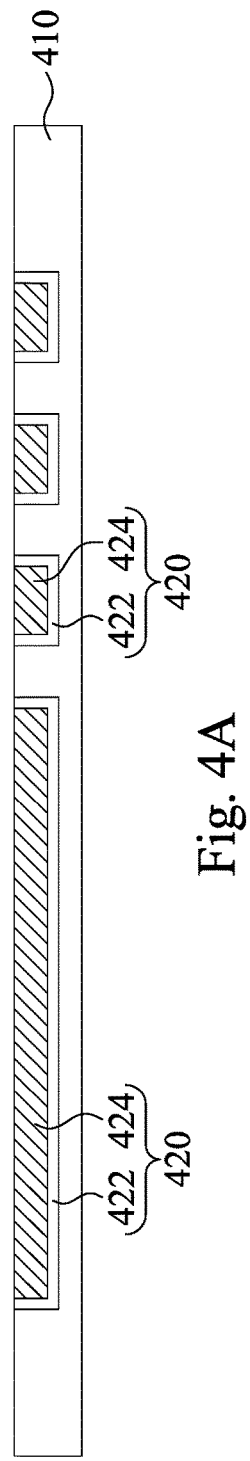
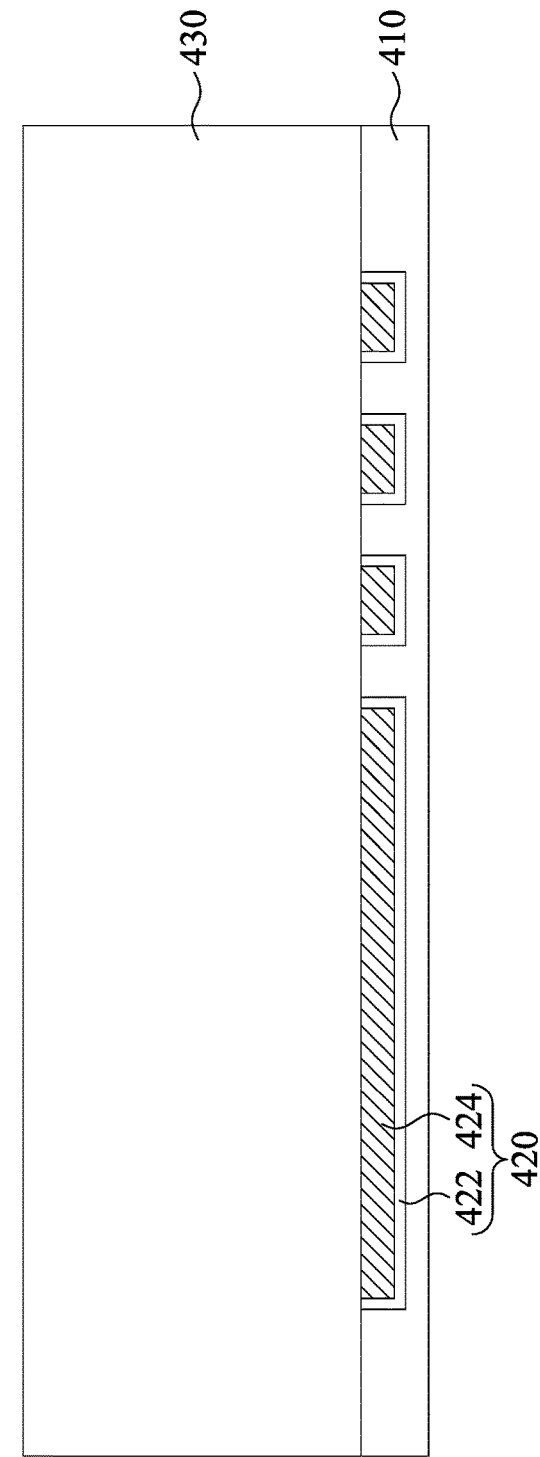
Fig. 4A
Fig. 4B

SEMICONDUCTOR STRUCTURE AND METHOD OF FABRICATING WIRING STRUCTURE

CROSS-REFERENCE TO RELATED APPLICATION

This application claims priority to Taiwan Application Serial Number 108118802, filed May 30, 2019, which is herein incorporated by reference in its entirety.

BACKGROUND

Field of Invention

The present disclosure relates to a semiconductor structure and a manufacturing method of the semiconductor structure.

Description of Related Art

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, interconnection of conductive lines and associated dielectric materials that facilitate wiring between the transistors and other devices play a more and more important role in IC performance improvement.

SUMMARY

An aspect of the disclosure provides a semiconductor structure. The semiconductor structure includes a semiconductor device, a first metallization layer on the semiconductor device, a second metallization layer on the first metallization layer, and a third dielectric layer between the first metallization layer and the second metallization layer. The first metallization layer includes a first dielectric layer and a first metal layer disposed in the first dielectric layer, wherein the first metal layer has a first thickness, and the first metal layer comprises copper. The third dielectric layer has a second thickness, and a ratio of the second thickness of the third dielectric layer to the first thickness of the first metal layer is ranged from about 3 to about 20.

According to some embodiments, the second metallization layer includes a second dielectric layer and a second metal layer disposed in the second dielectric layer, and a material of the second metal layer is different from that of the first metal layer.

According to some embodiments, the semiconductor structure further includes a via plug disposed in the third dielectric layer and interconnecting the first metal layer and the second metal layer.

According to some embodiments, the first metal layer includes a plurality of first metal lines, the second metal layer includes a plurality of second metal lines, and a direction of the first metal lines is orthogonal to a direction of the second metal lines.

According to some embodiments, a width of the first metal lines is narrower than a width of the second metal lines.

According to some embodiments, the first metal lines are bit lines.

According to some embodiments, the semiconductor device is a vertical memory component.

Another aspect of the disclosure provides a semiconductor structure. The semiconductor structure includes a semiconductor device, a first dielectric layer on the semiconductor device, a first metal layer disposed in the first dielectric layer, and a second dielectric layer on the semiconductor device. The first metal layer has a first thickness ranging from about 300 Å to about 700 Å, and the first metal layer comprises copper. The second dielectric layer is in contact with a top surface of the first metal layer, and the second dielectric layer has a second thickness ranging from about 2000 Å to about 6000 Å.

According to some embodiments, the semiconductor structure further includes a via plug disposed in the second dielectric layer and in contact with the first metal layer.

According to some embodiments, the first metal layer includes a plurality of first metal lines, the semiconductor structure includes a plurality of second metal lines on the semiconductor device, and a width of the first metal lines is narrower than a width of the second metal lines.

According to some embodiments, the first metal lines and the second metal lines are made of different materials.

According to some embodiments, the first metal lines are bit lines.

According to some embodiments, the semiconductor device is a vertical memory component.

Yet another aspect of the disclosure provides a method of fabricating a wiring structure. A first metallization layer is formed on a semiconductor device, wherein the first metallization layer includes a first dielectric layer and a first metal layer, and the first metal layer includes copper. A second dielectric layer is formed on the first dielectric layer and the first metal layer, wherein a ratio of a thickness of the second dielectric layer to a thickness of the first metal layer is ranged from about 3 to about 20. A via hole is formed in the second dielectric layer to expose the first metal layer.

According to some embodiments, the via hole is formed by performing a plasma etching process.

According to some embodiments, the thickness of the first metal layer is ranged from about 300 Å to about 700 Å, and the thickness of the second dielectric layer is ranged from about 2000 Å to about 6000 Å.

According to some embodiments, the second dielectric layer comprises a low-k dielectric material.

According to some embodiments, the method further includes filling a conductive material in the via hole to form a via plug in the second dielectric layer.

According to some embodiments, the method further includes forming a second metallization layer on the second dielectric layer and the via plug.

According to some embodiments, the first metal layer includes a plurality of metal lines.

The present application relates to adjust a ratio of the thicknesses and/or the thicknesses of the copper material and the dielectric material thereon, such that after the via hole formation process is performed, the stress between the dielectric material and the copper material can be well balanced, thereby preventing copper migration.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 4A to FIG. 4D are schematic cross-sectional views of different stages of fabricating a wiring structure according to some embodiments of the disclosure.

DESCRIPTION OF THE EMBODIMENTS

Figure 1:
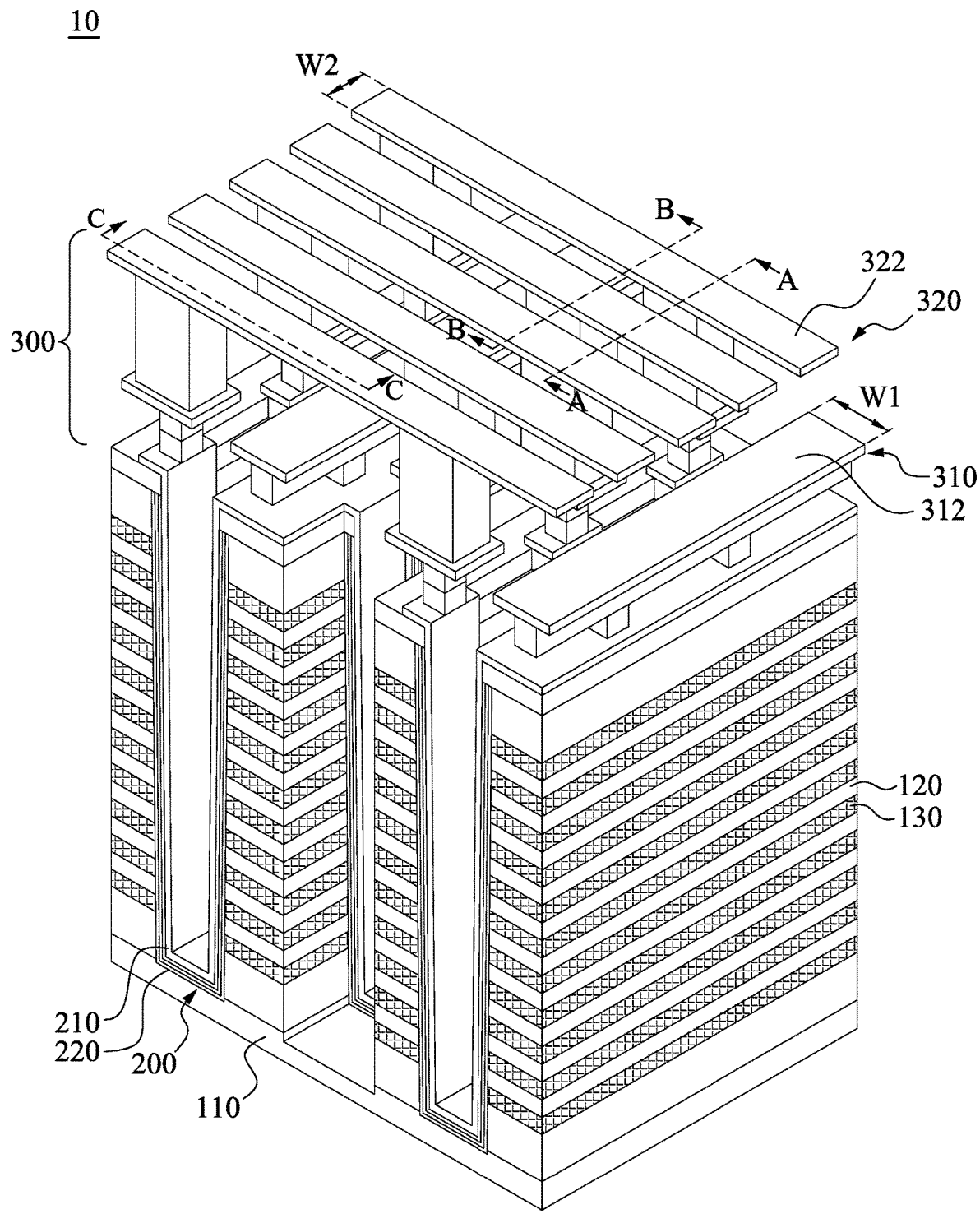
FIG. 1 is a perspective view of a semiconductor structure according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts. As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The semiconductor manufacturing process at least includes two major components, namely the Front-End-of-Line (FEOL), which includes the multilayer process of forming semiconductor devices (transistors, etc.) on a semiconductor substrate, and the Back-End-Of-Line (BEOL), which includes metallization after the semiconductor devices have been formed. These semiconductor devices need to be electronically connected through wiring. In an integrated circuit, such wiring is performed through multiple metallization layers on top of the semiconductor devices formed on the semiconductor substrate.

Each metallization layer a plurality of metal lines embedded in one or more dielectric layers. In some embodiments, the semiconductor manufacturing processes can involve multiple metallization layers, and the metallization layers are interconnected by through via plugs. As scaling down of microelectronic devices, many material and module process challenges in BEOL patterning need to be solved. This application is related to a mechanism to suppress copper (Cu) migration in the semiconductor process.

Figure 2A:
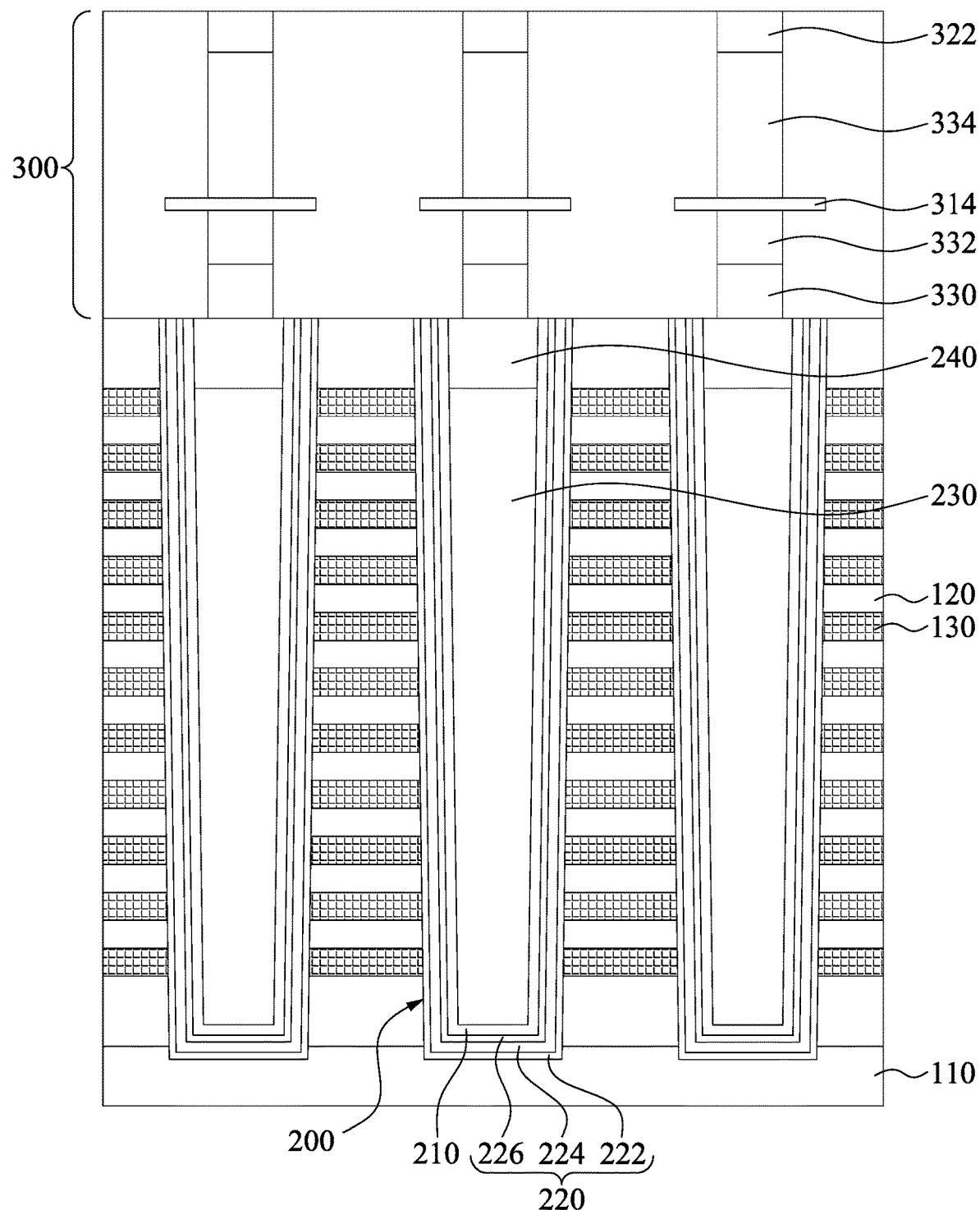
FIG. 2A is a cross-sectional view taken along line A-A in FIG. 1.
Figure 2B:
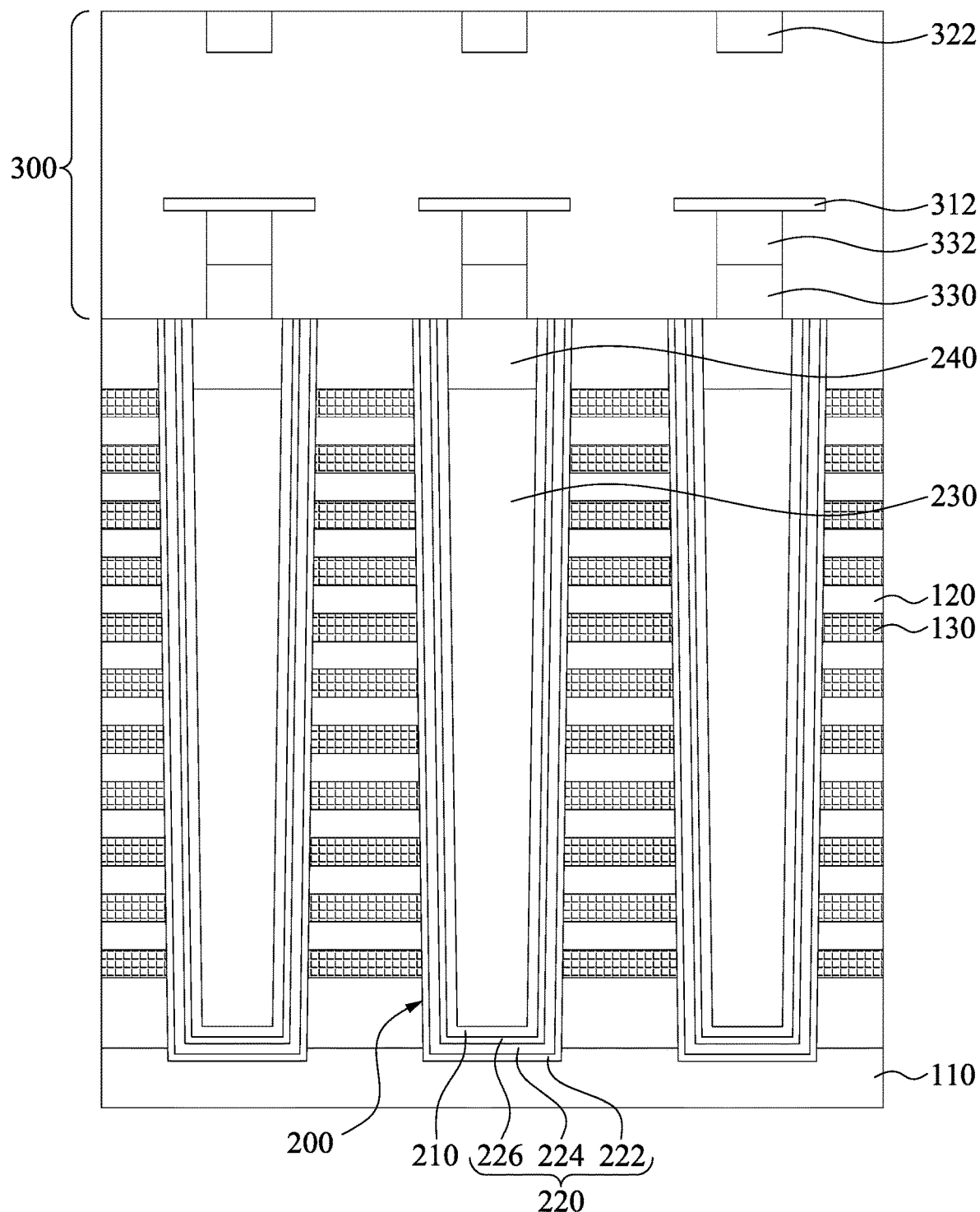
FIG. 2B is a cross-sectional view taken along line B-B in FIG. 1.
Figure 2C:
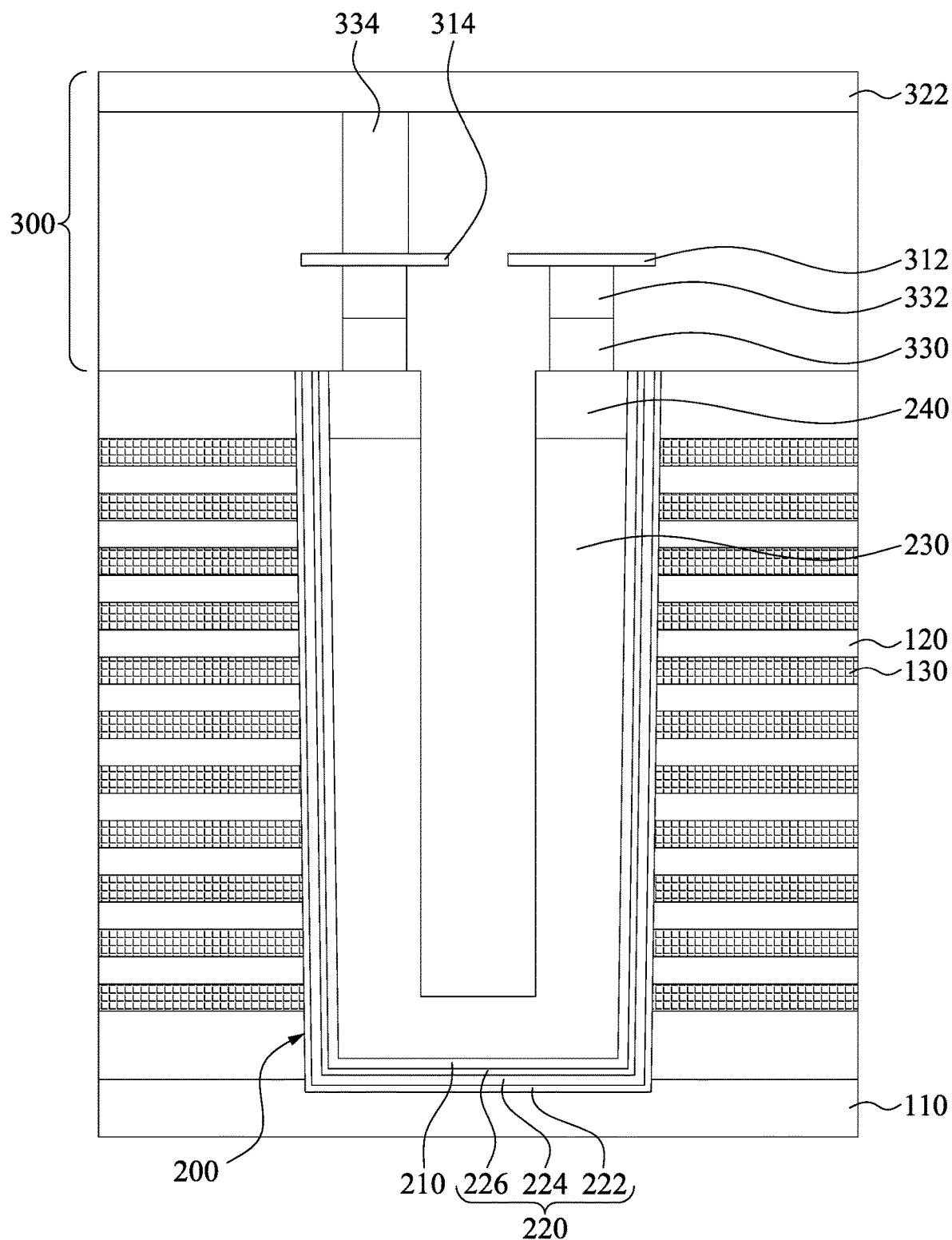
FIG. 2C is a cross-sectional view taken along line C-C in FIG. 1.

Reference is made to FIG. 1 and FIGS. 2A, 2B, 2C, in which FIG. 1 is a perspective view of a semiconductor structure according to some embodiments of the disclosure; FIG. 2A is a cross-sectional view taken along line A-A in FIG. 1; FIG. 2B is a cross-sectional view taken along line B-B in FIG. 1; and FIG. 2C is a cross-sectional view taken along line C-C in FIG. 1.

The semiconductor structure 10 includes a substrate 110, a plurality of conductive layers 120 and a plurality of dielectric layers 130 interlaced and stacked on the substrate 110, a plurality of memory components 200 penetrating through the conductive layers 120 and the dielectric layers 130, and a wiring structure 300 disposed on and electrically connected to the memory components 200.

The memory components 200 can be vertical memory components and arranged in an array. Each of the memory components 200 includes a channel layer 210 and a memory structure layer 220 and is embedded in the stack of the conductive layers 120 and the dielectric layers 130. In some embodiments, the channel layer 210 has a U-shaped cross-section, and the memory structure layer 220 is disposed between the channel layer 210 and the stack of the conductive layers 120 and the dielectric layers 130.

In some embodiments, each of the conductive layers 120 includes a barrier layer disposed on each of the dielectric layers 130 and a metal layer disposed on the barrier layer. The barrier layer may be made of a material including titanium nitride, and the metal layer may be made of a material including tungsten or other metal, but the present disclosure is not limited in this regard. The dielectric layer 130 may be made of a material including silicon oxide or other dielectric, but the present disclosure is not limited in this regard. In some other embodiments, a high-k dielectric layer can be optionally interposed between the conductive layer 120 and the dielectric layer 130.

The memory structure layer 220 includes a blocking layer 222, a memory storage layer 224, and a tunneling layer 226. The blocking layer 222 is disposed on the substrate 110 and sidewalls of the conductive layers 120 and the dielectric layers 130, the memory storage layer 224 is disposed on the blocking layer 222, and the tunneling layer 226 is disposed on the memory storage layer 224. In some embodiments, the blocking layer 222 and the tunneling layer 226 may be made of a material including silicon oxide or other dielectric, the memory storage layer 224 may be made of a material including silicon nitride or other material that is able to trap electrons, and the channel layer 210 may be made of a material including doped or undoped polysilicon, but the present disclosure is not limited in this regard.

In some embodiments, each of the memory components 200 includes an isolation structure 230 embedded between the U-shaped channel layer 210, and a conductive plug 240 on the isolation structure 230. The conductive plug 240 may be made of the same material as that of the channel layer 210, and the conductive plug 240 is connected to the channel layer 210. It is noted that the memory components 200 discussed above are only an example of semiconductor devices, and the scope of the disclosure should not be limited in this regard.

The wiring structure 300 is disposed on the memory components 200 to connect the memory components 200 to external circuits. For example, the wiring structure 300 includes a first metallization layer 310 and a second metallization layer 320. The first metallization layer 310 includes a plurality of first metal lines 312 extending along a first direction, and the first metal lines 312 are parallel to each other. The second metallization layer 320 includes a plurality of second metal lines 322 extending along a second direction, and the second metal lines 322 are parallel to each other. The first direction is different from the second direction. In some embodiments, the first direction and the second direction are orthogonal.

In some embodiments, the first metallization layer 310 is closer to the memory components 200, and the second metallization layer 320 is at a wiring level higher than the first metallization layer 310. As a result, the first metallization layer 310 is also regarded as a M1 layer, and the second metallization layer 320 is also regarded as a M2 layer. The first metal lines 312 of the first metallization layer 310 are connected to the corresponding memory components 200 through a plurality of via plugs 330, 332. The second metal lines 322 of the second metallization layer 320 are connected to the corresponding memory components 200 through the via plugs 330, 332, 334, and the landing pads 314 of the first metallization layer 310.

As shown in this embodiment, the first metal lines 312 can be signal lines, such as common source lines (CSLs), and the second metal lines 322 can be bit lines. The second metal lines 322 are disposed on the first metal lines 312 and cross on the first metal lines 312. In some embodiments, the density of the second metal lines 322 of the second metallization layer 320 is greater than the density of the first metal lines 312 of the first metallization layer 310, such that the width W2 of the second metal lines 322 is narrow than the width W1 of the first metal lines 312, for better space utilization. For example, the width W1 of the first metal lines 312 is about three times wider than the width W2 of the second metal lines 322.

Since the resistance of the metal lines is related to the width of the metal lines, the second metal lines 322 having narrow width W2 can be made of a material that has better conductively than that of the first metal lines 312. For example, the material of the first metal lines 312 can include tungsten (W), and the material of the second metal lines 322 can include copper (Cu). Since copper is a better conductor than tungsten, energy to pass electricity through the second metal lines 322 can be reduced.

Figure 3:
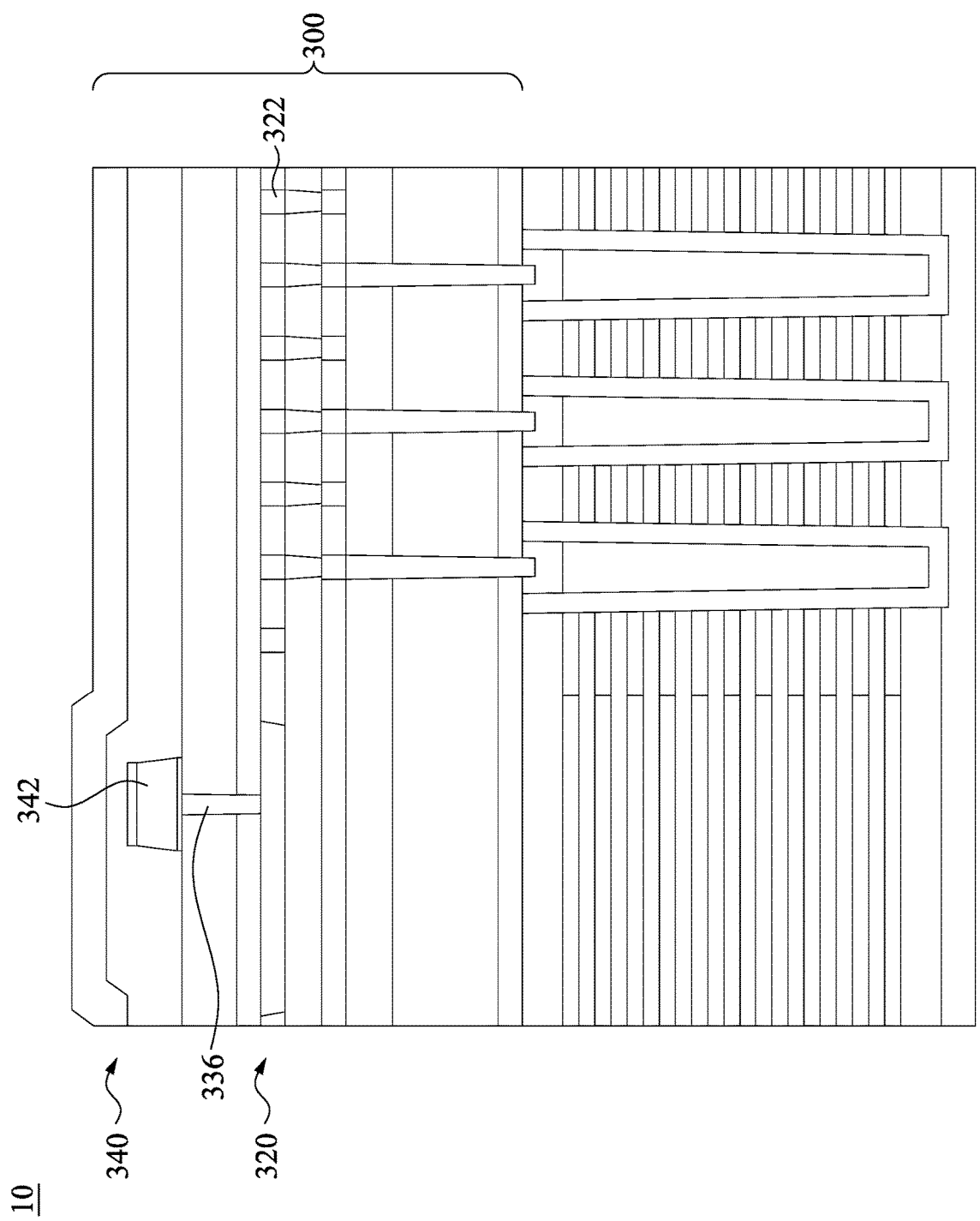
FIG. 3 is a cross-sectional view of the semiconductor structure according to some embodiments of the disclosure.

The first metallization layer 310 and the second metallization layer 320 are further connected to additional layers, as shown in FIG. 3.

Reference is made to FIG. 3, which is a cross-sectional view of the semiconductor structure according to some embodiments of the disclosure. The wiring structure 300 further includes a third metallization layer 340, and the second metallization layer 320 is connected to the third metallization layer 340 through the via plugs 336. In some embodiments, the width of the second metal lines 322 of the second metallization layer 320 is narrower than the width of the third metal lines 342 of the third metallization layer 340, and the material of third metal lines 342 of the third metallization layer 340 is different from the second metal lines 322 of the second metallization layer 320. For example, the material of the third metal lines 342 of the third metallization layer 340 can be tungsten, and the material of the second metal lines 322 of the second metallization layer 320 can be copper.

Figure 4C:
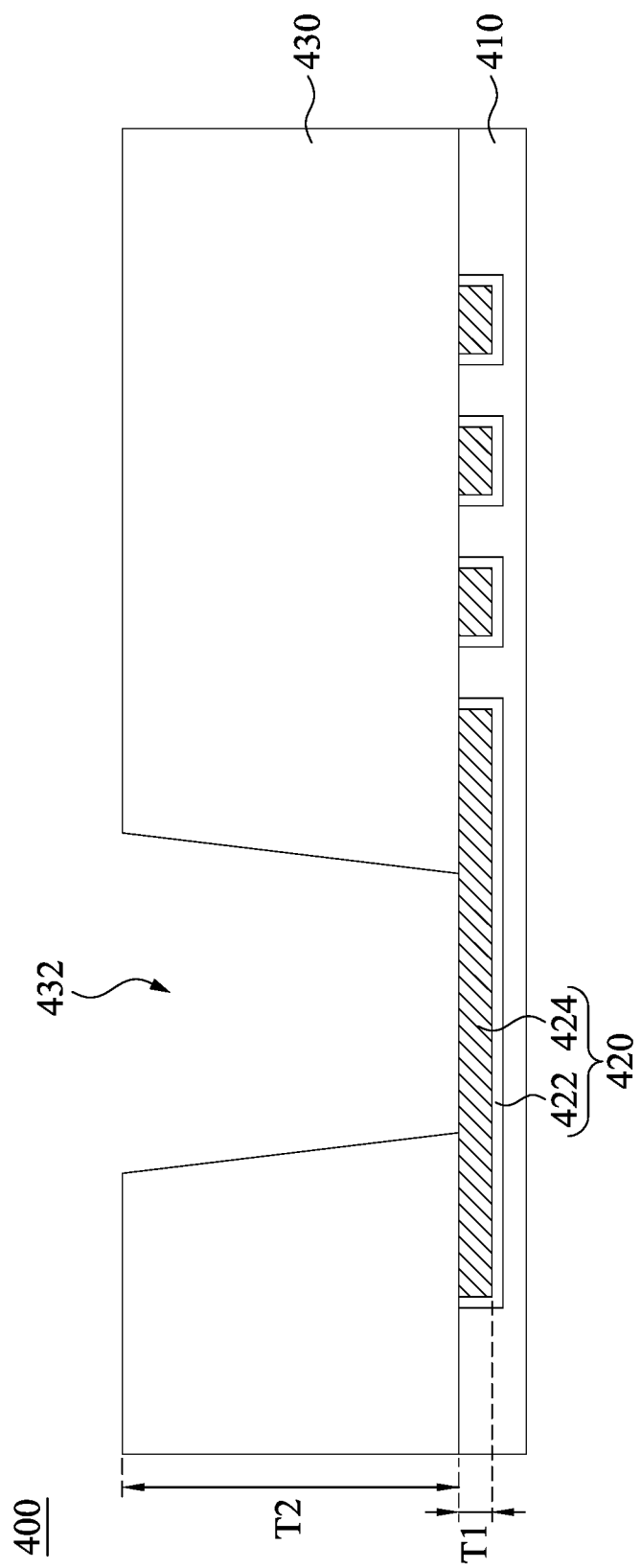

Due to the different material characteristics of the metallization layers, some unwanted defects would be raised during the fabrication processes. Reference is made to FIG. 4A to FIG. 4D, which are schematic cross-sectional views of different stages of fabricating a wiring structure 400 according to some embodiments of the disclosure. As shown in FIG. 4A, the wiring structure 400 at least includes a first dielectric layer 410 and a first metal layer 420 disposed in the first dielectric layer 410. The top surface of the first metal layer 420 is exposed from the first dielectric layer 410, and the top surface of the first metal layer 420 is substantially coplanar with the top surface of the first dielectric layer 410. The first metal layer 420 is a patterned metal layer, and the first dielectric layer 410 and the first metal layer 420 construct a metallization layer and are formed on the semiconductor device.

In some embodiments, the position of the first dielectric layer 410 and the first metal layer 420 is at the same wiring level as the second metallization layer 320 as shown in FIGS. 2A-2C, and the portions of the first metal layer 420 form the second metal lines 322, including the bit lines, on the semiconductor device, such as the memory components 200 in FIG. 1.

In some embodiments, the material of the first dielectric layer 410 can include $SiO_2$, and the material of the first metal layer 420 can include copper. In some embodiments, the first metal layer 420 includes a barrier layer 422, such as a TiN layer, and a conductive material 424, such as copper, and the barrier layer 422 is formed between the conductive material 424 and the first dielectric layer 410.

Then, as shown in FIG. 4B, a second dielectric layer 430 is formed on the first dielectric layer 410 and the first metal layer 420. The second dielectric layer 430 is in contact with top surface of the first metal layer 420. In some embodiments, the material of the second dielectric layer 430 includes a variety of low-k dielectrics, including silicon dioxide, silicon oxynitride, silicon nitride, or the like. In some other embodiments, the second dielectric layer 430 may be deposited by chemical vapor deposition (CVD).

Referring to FIG. 4C, after the second dielectric layer 430 is formed on the first dielectric layer 410 and the first metal layer 420, an etching process is performed to pattern the second dielectric layer 430, such that at least one via hole 432 is formed in the second dielectric layer 430 to expose a portion of the first metal layer 420.

In some embodiments, the via hole 432 is formed by using a plasma etching process, with a gas (or gas mixture) containing a halogen gas (such as $Cl_2$, HCl and the like), a reducing gas (such as carbon monoxide (CO), and an etch rate control gas (at least one of Ar or $O_2$). In some embodiments, the process temperature of the plasma etching process is ranged from about 10 degrees Celsius to about 30 degrees Celsius.

However, the copper material exposed by the via hole 432 is easy to migrate upward and is adhered on sidewalls or a top surface of the second dielectric layer 430 after the plasma etching process of forming the via hole 432 is performed. The reasons of the copper migration include the copper characteristic and the unbalance stress between the dielectric material and the copper material generated during the via hole formation process using plasma etching.

Therefore, the present application provides a mechanism, including adjusting a ratio of the thicknesses and/or the thicknesses of the copper material and the dielectric material thereon, such that the stress between the dielectric material and the copper material can be well balanced.

Reference is still made to FIG. 4C. The first thickness T1 of the conductive material 424 of the first metal layer 420, which includes copper material, is in a range from about 300 Å to about 700 Å. The second thickness T2 of the second dielectric layer 430, which includes low-k dielectric material, is in a range from about 2000 Å to about 6000 Å. By carefully designing the first thickness T1 of the conductive material 424 of the first metal layer 420 and the second thickness T2 of the second dielectric layer 430, the stress generated by copper during the following via hole formation process, such as plasma etching process can be well balanced.

On the other hand, if the first thickness T1 of the conductive material 424 of the first metal layer 420 is smaller than 300 Å, the resistance of the first metal layer 420 would be too large. If the first thickness T1 of the conductive material 424 of the first metal layer 420 is greater than 700 Å, the stress generated by copper would be too large, and the issue of parasitic capacitance between the metal lines of the first metal layer 420 would be raised. If the second thickness T2 of the second dielectric layer 430 is smaller than 2000 Å, the stress generated by the second dielectric layer 430 is insufficient to balance the stress generated by the first metal layer 420. If the second thickness T2 of the second dielectric layer 430 is greater than 6000 Å, the depth of the via hole 432 would be too deep, which may lead to the problem of via filling failure.

In some other embodiments, the stress balance between the dielectric material and the copper material can be balanced by controlling the ratio of the first thickness T1 of the conductive material 424 of the first metal layer 420 and the second thickness T2 of the second dielectric layer 430. For example, the ratio of the second thickness T2 of the second dielectric layer 430 to the first thickness T1 of the conductive material 424 of the first metal layer 420 can be ranged from about 3 to about 20. If the ratio of the second thickness T2 of the second dielectric layer 430 to the first thickness T1 of the conductive material 424 of the first metal layer 420 is smaller than 3, the stress generated by the second dielectric layer 430 is insufficient to balance the stress generated by the first metal layer 420. If the ratio of the second thickness T2 of the second dielectric layer 430 to the first thickness T1 of the conductive material 424 of the first metal layer 420 is greater than 20, the depth of the via hole 432 would be too deep, which may lead to the problem of via filling failure.

Figure 4D:
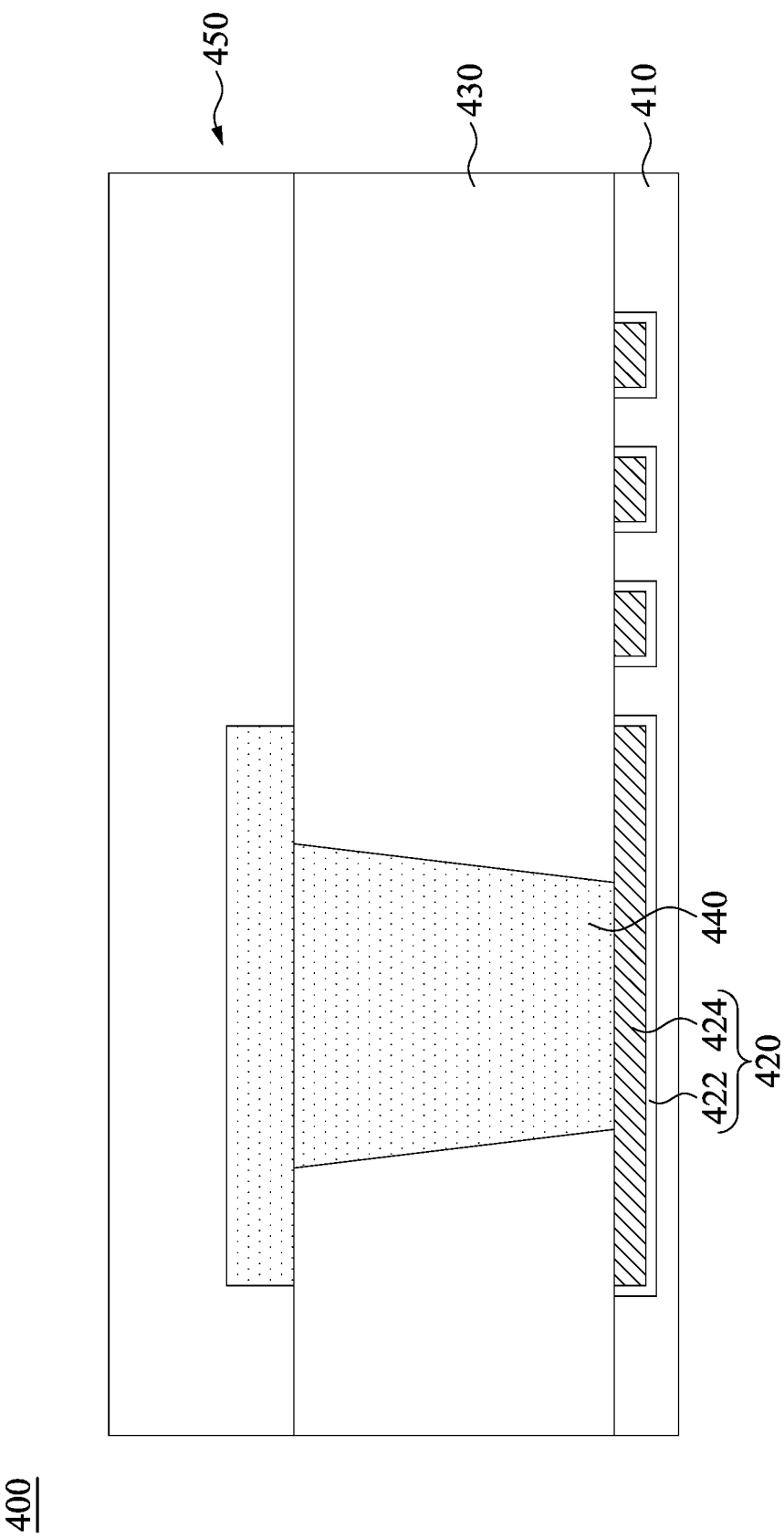

Reference is made to FIG. 4D. As discussed above, the thicknesses of the first metal layer 420 and the second dielectric layer 430 (or the ratio thereof) are controlled, such that the copper material of the first metal layer 420 does not migrate after the plasma etching process. Then, a depositing process is performed to deposit an electrically conductive material within the via hole 432 in order to provide an electrically conductive link to an additional metallization layer 450.

Depositing the electrically conductive material includes any suitable process, and the materials can be TiN, W, TiW, TiWN, TiC, WC, or the like. After the conductive material is deposited in the via hole 432 and on the second dielectric layer 430, a planarization process is preformed to provide a planar surface upon which further processing may take place. As a result, a via plug 440 is formed in the second dielectric layer 430, to interconnect the first metal layer 420 and the additional metallization layer 450.

Figure 5:
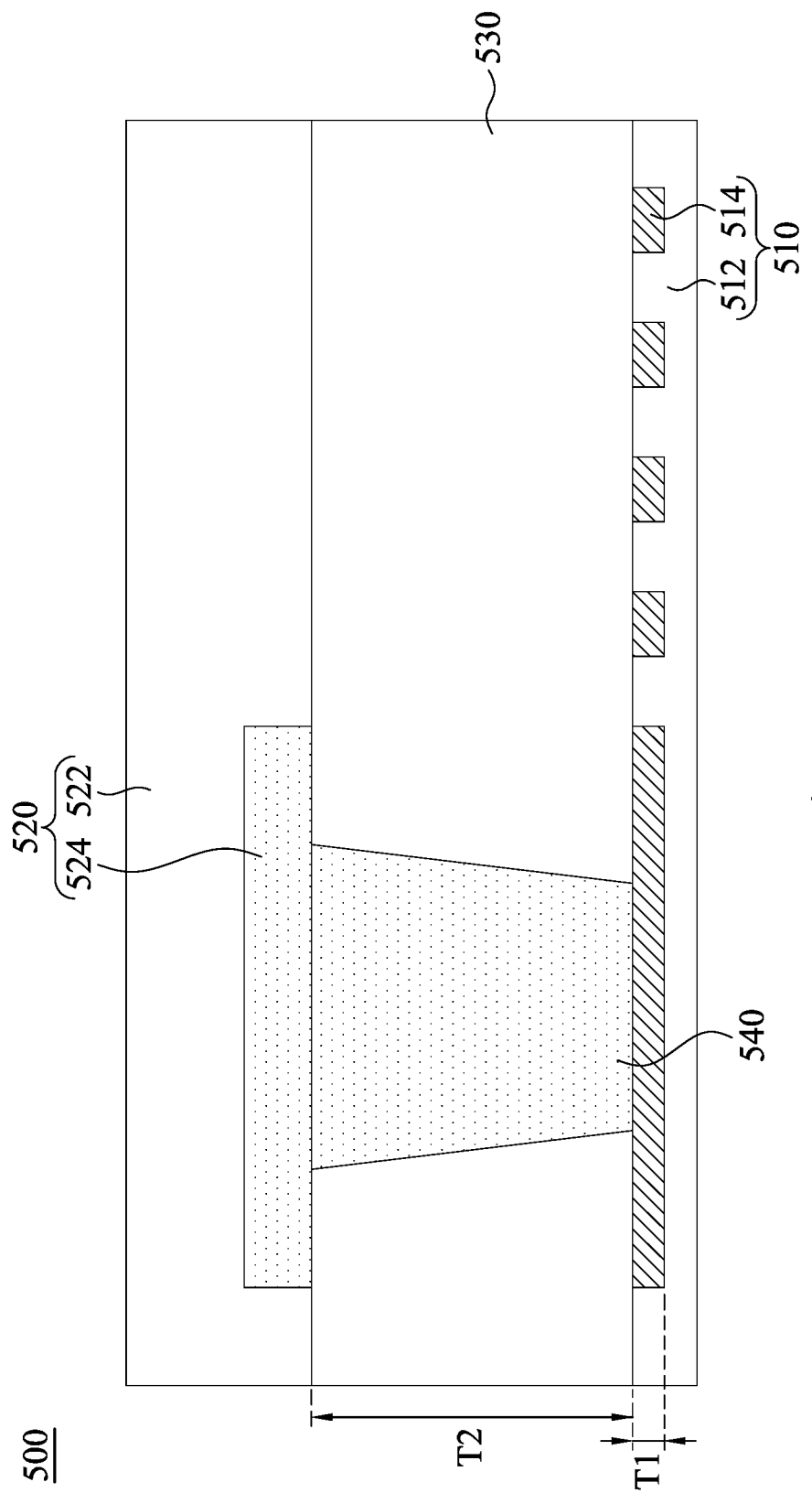
FIG. 5, FIG. 6, and FIG. 7 are cross-sectional views of some other embodiments of a wiring structure of the disclosure.
Figure 6:
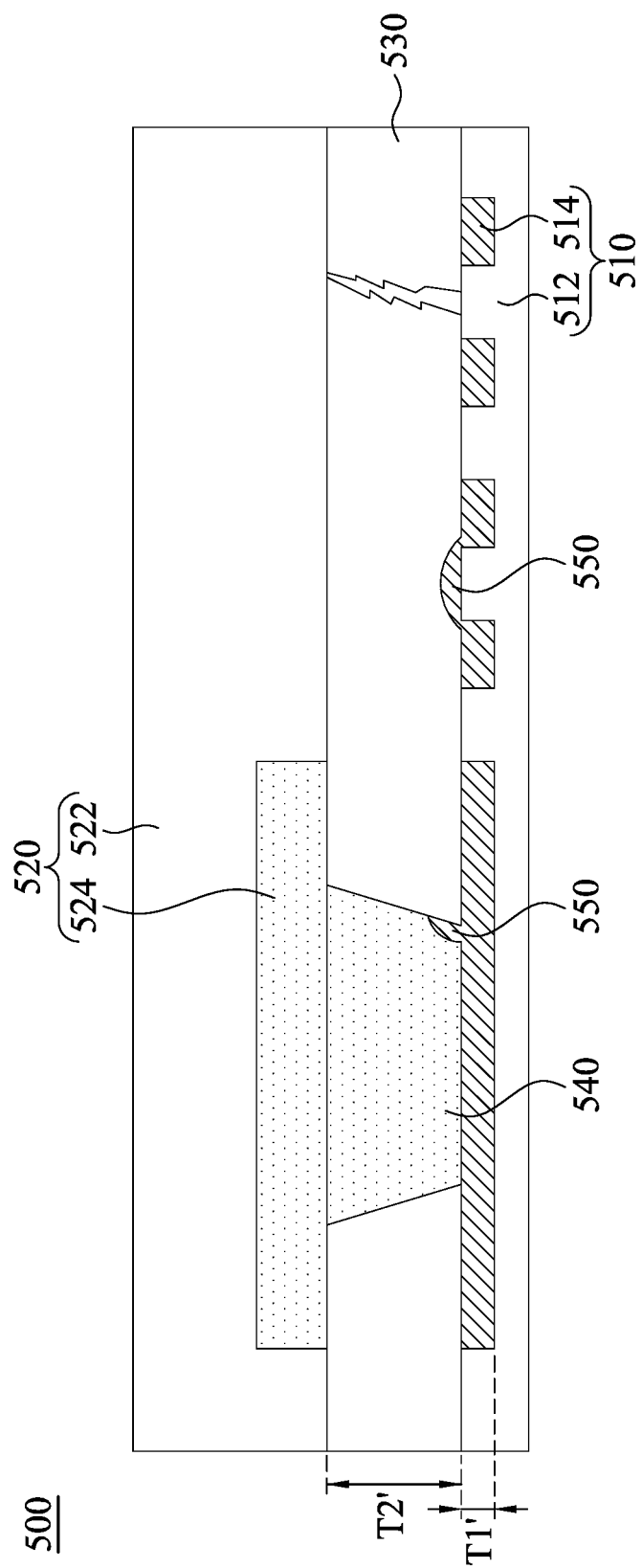
Figure 7:
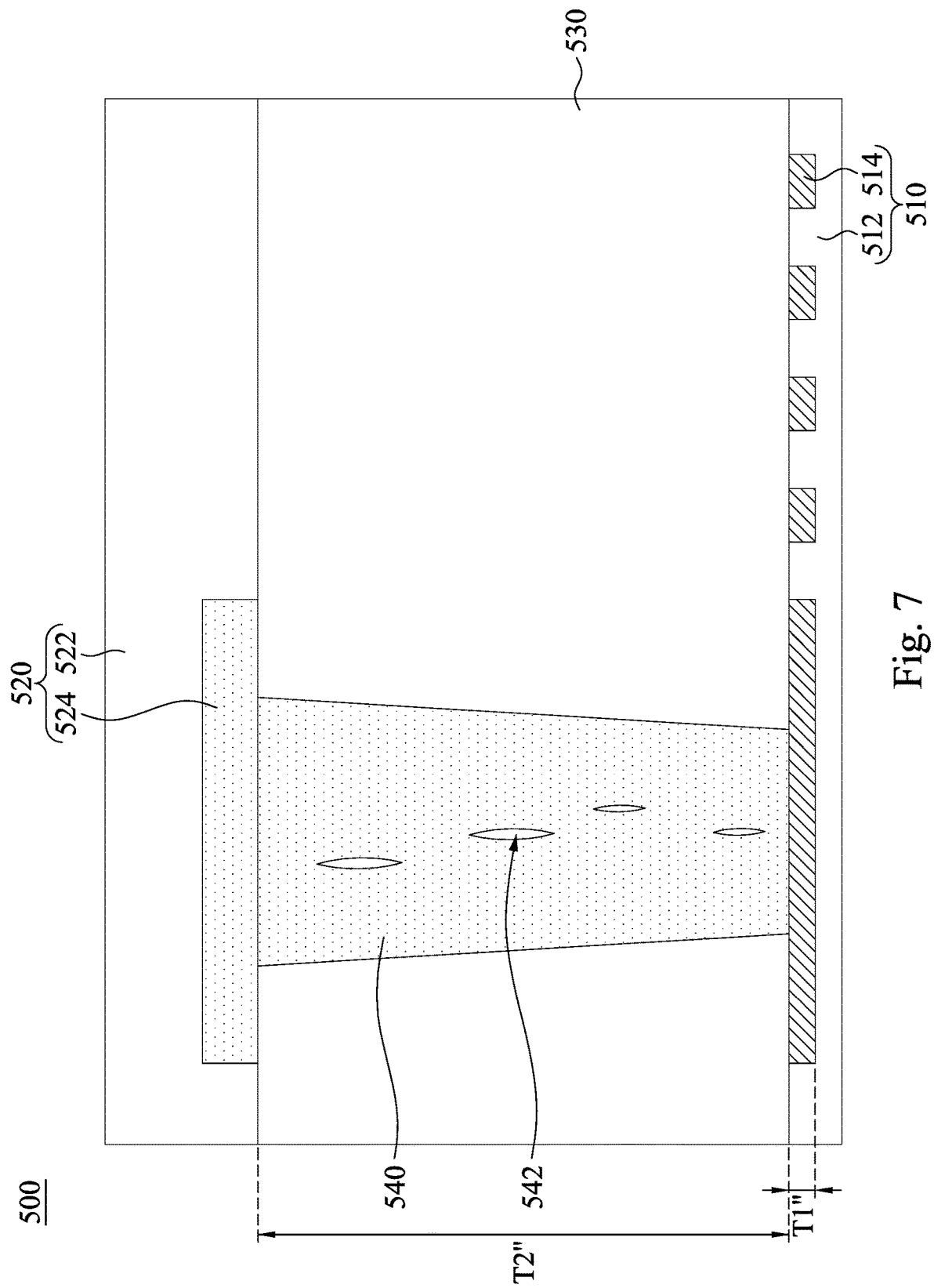

Reference is made to FIG. 5, FIG. 6, and FIG. 7, which are cross-sectional views of some other embodiments of a wiring structure of the disclosure. As shown in FIG. 5, the wiring structure 500 includes a first metallization layer 510 and a second metallization layer 520 on the first metallization layer 510. The first metallization layer 510 includes a first dielectric layer 512 and a first metal layer 514. The second metallization layer 520 includes a second dielectric layer 522 and a second metal layer 524. The wiring structure 500 further includes a third dielectric layer 530 disposed between the first metallization layer 510 and the second metallization layer 520. The wiring structure 500 further includes at least one via plug 540 disposed in the third dielectric layer 530 to interconnect the first metallization layer 510 and the second metallization layer 520.

The material of the first metal layer 514 of the first metallization layer 510 includes copper. In some embodiments, the first thickness T1 of the first metal layer 514 is in a range from about 300 Å to about 700 Å, and the second thickness T2 of the third dielectric layer 530 is ranged from about 2000 Å to about 6000 Å. Or, in some other embodiments, the ratio of the second thickness T2 of the third dielectric layer 530 to the first thickness T1 of the first metal layer 514 is in a range from about 3 to about 20. Thus the stress between the copper material of the first metal layer 514 and the third dielectric layer 530 can be well balanced to suppress copper migration.

In some other embodiments, as shown in FIG. 6, the ratio of the second thickness T2' of the third dielectric layer 530 to the first thickness T1' of the first metal layer 514 is below 3, or the third dielectric layer 530 is thinner than 2000 Å. The third dielectric layer 530 is not able to provide sufficient stress to balance the stress generated by copper material of the first metal layer 514 after a via hole formation process is performed. As a result, the copper migrates after the via hole formation process is performed, and copper residues 550 are adhered at sidewalls of the via plug 540 or between the first metallization layer 510 and the third dielectric layer 530 to bridge the adjacent metal lines of the first metal layer 514. In addition, the third dielectric layer 530 may crack because of the stress from the first metallization layer 510.

In yet some other embodiments, as shown in FIG. 7, the ratio of the second thickness T2" of the third dielectric layer 530 to the first thickness T1" of the first metal layer 514 is greater than 20, or the third dielectric layer 530 is thicker than 6000 Å. The ratio of the height to the width (e.g. the aspect ratio) of the via plug 540 is too large, such that some via filling issue would be raised. For example, some voids 542 are formed in the via plug 540.

As discussed above, the present application relates to adjust a ratio of the thicknesses and/or the thicknesses of the copper material and the dielectric material thereon, such that after the via hole formation process is performed, the stress between the dielectric material and the copper material can be well balanced, thereby preventing copper migration.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the invention can cover modifications and variations of this invention provided they fall within the scope of the following claims and their equivalents.

What is claimed is:

1. A semiconductor structure, comprising:
   a semiconductor device;
   a first metallization layer on the semiconductor device, the first metallization layer comprising a first dielectric layer and a first metal layer disposed in the first dielectric layer, wherein the first metal layer has a first thickness, and the first metal layer comprises copper;
   a second metallization layer on the first metallization layer; and
   a third dielectric layer between the first metallization layer and the second metallization layer, wherein the third dielectric layer is a monolithic structure and is directly in contact with the first metal layer, the third dielectric layer has a second thickness, and a ratio of the second thickness of the third dielectric layer to the first thickness of the first metal layer is ranged from about 3 to about 20.

2. The semiconductor structure of claim 1, wherein the second metallization layer comprises a second dielectric layer and a second metal layer disposed in the second dielectric layer, and a material of the second metal layer is different from that of the first metal layer.

3. The semiconductor structure of claim 2, further comprising a via plug, disposed in the third dielectric layer and interconnecting the first metal layer and the second metal layer.

4. The semiconductor structure of claim 2, wherein the first metal layer comprises a plurality of first metal lines, the second metal layer comprises a plurality of second metal lines, and a direction of the first metal lines is orthogonal to a direction of the second metal lines.

5. The semiconductor structure of claim 4, wherein a width of the first metal lines is narrower than a width of the second metal lines.

6. The semiconductor structure of claim 4, wherein the first metal lines are bit lines.

7. The semiconductor structure of claim 1, wherein the semiconductor device is a vertical memory component.

8. A semiconductor structure, comprising:
   a semiconductor device;
   a first dielectric layer on the semiconductor device;
   a first metal layer disposed in the first dielectric layer, wherein the first metal layer has a first thickness ranging from about 300 Å to about 700 Å, and the first metal layer comprises copper; and
   a second dielectric layer on the semiconductor device and directly in contact with a top surface of the first metal layer, wherein the second dielectric layer is a monolithic structure, and the second dielectric layer has a second thickness ranging from about 2000 Å to about 6000 Å.

9. The semiconductor structure of claim 8, further comprising a via plug disposed in the second dielectric layer and in contact with the first metal layer.

10. The semiconductor structure of claim 8, wherein the first metal layer comprises a plurality of first metal lines, the semiconductor structure comprises a plurality of second metal lines on the semiconductor device, and a width of the first metal lines is narrower than a width of the second metal lines.

11. The semiconductor structure of claim 10, wherein the first metal lines and the second metal lines are made of different materials.

12. The semiconductor structure of claim 10, wherein the first metal lines are bit lines.

13. The semiconductor structure of claim 8, wherein the semiconductor device is a vertical memory component.

14. A method of fabricating a wiring structure, comprising:
   forming a first metallization layer on a semiconductor device, wherein the first metallization layer comprises a first dielectric layer and a first metal layer, and the first metal layer comprises copper;
   forming a second dielectric layer on the first dielectric layer and the first metal layer, wherein the second dielectric is a monolithic structure and is directly in contact with the first metal layer, and a ratio of a thickness of the second dielectric layer to a thickness of the first metal layer is ranged from about 3 to about 20; and
   forming a via hole in the second dielectric layer to expose the first metal layer.

15. The method of fabricating the wiring structure of claim 14, wherein forming a via hole comprises using a plasma etching process.

16. The method of fabricating the wiring structure of claim 14, wherein the thickness of the first metal layer is ranged from about 300 Å to about 700 Å, and the thickness of the second dielectric layer is ranged from about 2000 Å to about 6000 Å.

17. The method of fabricating the wiring structure of claim 14, wherein the second dielectric layer comprises a low-k dielectric material.

18. The method of fabricating the wiring structure of claim 14, further comprising filling a conductive material in the via hole to form a via plug in the second dielectric layer.

19. The method of fabricating the wiring structure of claim 18, further comprising forming a second metallization layer on the second dielectric layer and the via plug.

20. The method of fabricating the wiring structure of claim 14, wherein the first metal layer comprises a plurality of metal lines.

* * * * *